(12) United States Patent
Yu et al.

(10) Patent No.: US 6,238,968 B1
(45) Date of Patent: May 29, 2001

(54) METHODS OF FORMING INTEGRATED CIRCUIT CAPACITORS HAVING PROTECTED LAYERS OF HSG SILICON THEREIN

(75) Inventors: Young-Sub Yu; Hyun-Bo Shin, both of Kyunggi-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/526,850

(22) Filed: Mar. 16, 2000

(30) Foreign Application Priority Data

Mar. 18, 1999 (KR) .................................................. 99-09222

(51) Int. Cl.⁷ .............................................. H01L 21/8242
(52) U.S. Cl. ............................ 438/253; 438/254; 438/255; 438/381; 438/396; 438/397; 438/398
(58) Field of Search ..................................... 438/381, 252, 438/254, 255, 396, 397, 398

(56) References Cited

U.S. PATENT DOCUMENTS

| | | | |
|---|---|---|---|
| 4,636,833 | 1/1987 | Nishioka et al. | 357/71 |
| 5,102,820 | 4/1992 | Chiba | 437/52 |
| 5,142,438 | 8/1992 | Reinberg | 361/313 |
| 5,208,479 | 5/1993 | Mathews et al. | 257/534 |
| 5,227,651 | 7/1993 | Kim et al. | 257/309 |
| 5,234,857 | 8/1993 | Kim et al. | 437/47 |
| 5,278,091 | 1/1994 | Fazan et al. | 437/60 |
| 5,330,614 | 7/1994 | Ahn | 156/631 |
| 5,352,623 | 10/1994 | Kamiyama | 437/52 |
| 5,358,888 | 10/1994 | Ahn et al. | 437/52 |
| 5,362,632 | 11/1994 | Mathews | 437/47 |
| 5,385,863 | 1/1995 | Tatsumi et al. | 437/109 |
| 5,407,534 | 4/1995 | Thakur | 156/662 |
| 5,418,180 | * 5/1995 | Brown | 437/60 |
| 5,447,878 | 9/1995 | Park et al. | 437/52 |
| 5,447,881 | 9/1995 | Ryou | 437/60 |
| 5,452,178 | 9/1995 | Emesh et al. | 361/303 |
| 5,459,345 | 10/1995 | Okudaira et al. | 257/310 |
| 5,486,488 | 1/1996 | Kamiyama | 437/60 |
| 5,492,850 | 2/1996 | Ryou | 437/52 |
| 5,554,557 | 9/1996 | Koh | 437/52 |
| 5,597,754 | 1/1997 | Lou et al. | 437/52 |
| 5,608,247 | 3/1997 | Brown | 257/306 |
| 5,612,558 | 3/1997 | Harshfield | 257/298 |
| 5,618,747 | 4/1997 | Lou | 438/398 |
| 5,622,889 | 4/1997 | Yoo et al. | 438/397 |
| 5,623,243 | 4/1997 | Watanabe et al. | 257/309 |

(List continued on next page.)

OTHER PUBLICATIONS

Kamiyama et al., *Characterization of Ultra–Thin Capacitors Fabricated Using RTN Treatment Prior To CVD $Ta_2O_5$ Film Formation*, Extended Abstracts of the 1992 International Conference on Solid State Devices and Materials, Tsukuba, 1992, pp. 521–523.

Watanabe et al., "A New Cylindrical Capacitor Using Hemispherical Grained Si (HSG–Si) for 256 Mb DRAMs," IEEE, 1992, pp. 10.11–10.1.4.

*Primary Examiner*—Matthew Smith
*Assistant Examiner*—V. Yevsikov
(74) *Attorney, Agent, or Firm*—Myers Bigel Sibley & Sajovec

(57) ABSTRACT

Integrated circuit capacitors include a U-shaped capacitor electrode on a substrate and an HSG silicon layer extending on an inner surface of the U-shaped capacitor electrode. A HSG protection layer comprising silicon nitride is also provided. The HSG protection layer extends on the HSG silicon layer but not on an outer surface of the U-shaped capacitor electrode. A first capacitor dielectric layer comprising silicon nitride extends on the silicon nitride HSG protection layer and on the outer surface of the U-shaped capacitor electrode. A second capacitor dielectric layer comprising an oxide extends on the first capacitor dielectric layer and an upper capacitor electrode extends on the second capacitor dielectric layer.

20 Claims, 10 Drawing Sheets

U.S. PATENT DOCUMENTS

| | | | |
|---|---|---|---|
| 5,629,223 | 5/1997 | Thakur | 438/398 |
| 5,634,974 | 6/1997 | Weimer et al. | 117/103 |
| 5,639,685 | 6/1997 | Zahurak et al. | 437/69 |
| 5,650,351 * | 7/1997 | Wu | 437/52 |
| 5,656,531 | 8/1997 | Thakur et al. | 438/398 |
| 5,658,381 | 8/1997 | Thakur et al. | 257/309 |
| 5,663,085 | 9/1997 | Tanigawa | 438/255 |
| 5,663,090 | 9/1997 | Dennison et al. | 438/398 |
| 5,691,228 | 11/1997 | Ping et al. | 437/60 |
| 5,696,014 | 12/1997 | Figura | 437/52 |
| 5,721,153 | 2/1998 | Kim et al. | 437/60 |
| 5,721,171 | 2/1998 | Ping et al. | 438/398 |
| 5,726,085 | 3/1998 | Crenshaw et al. | 438/255 |
| 5,741,734 | 4/1998 | Lee | 438/235 |
| 5,753,559 | 5/1998 | Yew et al. | 438/398 |
| 5,759,262 | 6/1998 | Weimer et al. | 117/88 |
| 5,759,894 | 6/1998 | Tseng et al. | 438/255 |
| 5,763,306 | 6/1998 | Tsai | 438/255 |
| 5,798,280 | 8/1998 | Mathews et al. | 437/165 |
| 5,804,480 | 9/1998 | Lu et al. | 438/253 |
| 5,811,333 | 9/1998 | Zenke | 438/255 |
| 5,817,555 | 10/1998 | Cho | 438/253 |
| 5,821,152 | 10/1998 | Han et al. | 438/398 |
| 5,827,766 * | 10/1998 | Lou | 438/253 |
| 5,837,580 | 11/1998 | Thakur et al. | 438/255 |
| 5,837,581 | 11/1998 | Cheng | 438/255 |
| 5,851,876 * | 12/1998 | Jeng | 438/253 |
| 5,872,033 | 2/1999 | Figura | 438/255 |
| 5,874,336 | 2/1999 | Cherng | 438/255 |
| 5,885,867 | 3/1999 | Shin et al. | 438/255 |
| 5,885,869 | 3/1999 | Turner et al. | 438/261 |
| 5,891,744 | 4/1999 | Lowrey et al. | 438/14 |
| 5,897,352 | 4/1999 | Lin et al. | 438/255 |
| 5,899,725 | 5/1999 | Harshfield | 438/398 |
| 5,913,119 | 6/1999 | Lin et al. | 438/255 |
| 5,956,587 * | 9/1999 | Chen et al. | 438/255 |
| 6,105,568 * | 8/2000 | Fujiwara | 438/253 |

* cited by examiner

METHODS OF FORMING INTEGRATED CIRCUIT CAPACITORS HAVING PROTECTED LAYERS OF HSG SILICON THEREIN

BACKGROUND OF THE INVENTION

1. Field of the Invention

The present invention relates to a semiconductor device manufacturing, and more particularly to a cylindrical capacitor with hemi-spherical grain(HSG) silicon on its inner surfaces and a method for fabricating thereof.

2. Description of the Related Art

With the recent increase of integration density of a DRAM, a cell size and an area to be occupied by a capacitor of the DRAM cell tend to reduce, respectively. The capacitor is made of two opposite electrodes and a dielectric film disposed therebetween. As well known in the art, capacitor needs a minimum level of charge storage capacitance.

The capacitance is related to the dielectric thickness, dielectric permittivity and available surface areas. As is well known, the capacitance is proportional to dielectric permittivity and available surface areas and inversely proportional to dielectric thickness.

One way to increase capacitance in a given cell area is to form a thin dielectric film. Another way is to use a high dielectric film having high dielectric permittivity such as BST. Alternative approach is to increase the surface areas of the capacitor by increasing the topology such as a stacked capacitor. Such stacked capacitors include, for examples double-stacked, fin stacked, cylindrical, spread-stacked, and box structured capacitors.

Since both outer and inner surfaces can be utilized as an effective capacitor area, the cylindrical structure is favorably suitable to the three-dimensional stacked capacitor, and is more particularly suitable for an integrated memory cell. Recently, new technologies have been developed for increasing the effective surface area by modifying the surface morphology of the polysilicon storage electrode itself by engraving or controlling the nucleation and growth condition of polysilicon. A hemispherical-grain(HSG) polysilicon layer can be deposited over a storage node to increase surfaces area and capacitance.

A reference is made to the U.S. Pat. No. 5,827,766 by Lou entitled as "Method for fabricating cylindrical capacitor for a memory cell". The above cited reference forms HSG silicons on an inner surface of a cylindrical capacitor.

There are some problems with above cited reference and other methods for forming a cylindrical capacitor with HSG silicon. For example, HSG silicon may be sequestered from the capacitor after formation thereof during subsequent cleaning process using chemical etchant. As a result, sequestered HSG silicons degrade reliability of the capacitor.

Accordingly, there is a strong need for a method for forming a reliable capacitor with increased surface area in a given cell area by forming HSG silicon.

SUMMARY OF THE INVENTION

The present invention is directed toward providing a method for fabricating a reliable cylindrical capacitor having HSG silicon on its inner surfaces.

One of the features of the present invention is the formation of a silicon nitride layer on the HSG silicon in order to protect the HSG silicon during subsequent cleaning process. The silicon nitride layer can also be used as a dielectric component of nitride/oxide dielectric structure.

Briefly, in accordance with one aspect of the present invention, there is provided a method for fabricating a cylindrical capacitor which comprises forming a first insulating layer on an integrated circuit substrate. A contact plug is formed in the first insulating layer by the process of etching a selected portion of the first insulating layer to form a contact hole and filling the contact hole with a conductive material. A second insulating layer composed of PE-TEOS (plasma enhanced tetraethylorthosilicate) oxide is formed on the first oxide layer to a thickness of desired height of the storage node.

A cylindrical opening is formed in the second insulating layer. To obtain process margins, optional etching stopper nitride layer may be formed between two insulating layers. A first conductive material as for a storage node is deposited in the opening and on the second insulating layer. HSG silicons are formed on the first conductive layer. An HSG silicons. Protection layer is then formed. The protection layer is made of a nitride layer to a thickness of about at least 5 angstroms sufficient to protect HSG silicons during cleaning process. A Planarization layer composed of USG (undoped silicate glass) is deposited on the second insulating layer to completely fill the cylindrical opening. This Planarization layer serves to protect the contamination and defects of the interior cylinder. Planarization process is carried out on the Planarization layer down to a top surface of the second insulating layer.

Remainder of the planarization layer in the cylindrical opening is then selectively removed by chemical solution such as LAL to form a storage node. During this cleaning process, the HSG silicon is protected from the wet chemical due to the presence of the protection nitride layer. A second nitride layer as for a dielectric film is then formed on the storage node. Through oxidation process, an oxide layer is formed on the second nitride layer to complete dielectric layer of nitride/oxide. A second conductive layer as for a plate node is then deposited on the dielectric layer to form a cylindrical capacitor.

Resulting capacitor from the above-mentioned method is composed of a cylindrical storage node having HSG silicons on interior thereof, a dielectric film and a plate node. The dielectric film is made of nitride/oxide structure. More specifically, nitride/oxide structure is made of a protection nitride/second nitride/oxide at the interior storage node. On the other hand, nitride/oxide structure is made of second nitride/oxide at the exterior storage node. Bottom of the storage node is electrically connected to the top surface of the contact plug.

In above method, the second oxide layer outside of the storage node can be removed.

In another aspect of the present invention, nitride layer for undercutting formation can be formed on the first insulating layer. In this case the contact plug is formed in the nitride layer and the first insulating layer. More specifically, after depositing the first insulating layer on the integrated circuit substrate, the nitride layer is deposited thereon. Selected portion of the nitride layer and first insulating layer is etched to form a contact hole and then filled with a conductive material to form the contact plug. A second insulating layer is formed and a cylindrical opening is formed therein to the contact plug. A first conductive material is deposited in the opening and on the second insulating layer.

HSG silicons are formed on the first conductive layer and HSG silicon protection layer composed of nitride is formed. A Planarization layer is deposited on the second insulating layer to completely fill the cylindrical opening. Planarization process is carried out down to a top surface of the second insulating layer to form a storage node.

Remainder of the planarization layer in the cylindrical opening and the second insulating layer outside the storage node are removed by wet chemical using the nitride layer for undercutting as an etching stopper. The nitride layer is then selectively removed to cause the undercutting formation below the storage node and thus further increasing the surface area thereof.

Subsequently, nitride layer as for a dielectric is formed on the resulting structure and an oxide layer is then formed through oxidation process and thereby completing dielectric layer of nitride/oxide structure.

BRIEF DESCRIPTION OF THE DRAWINGS

These and other features, aspects, and advantages of the present invention will become better understood with regard to the following description, appended claims, and accompanying drawings where:

DETAILED DESCRIPTION OF THE PREFERRED EMBODIMENTS

Figure 1:
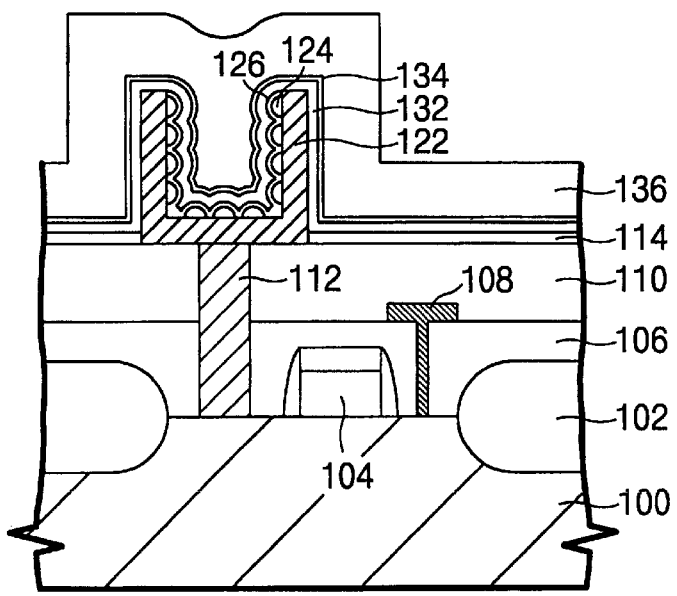
FIG. 1 shows schematically a cross-sectional view of a stacked capacitor having HSG silicons according to an embodiment of the present invention.

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will also be understood that when a layer is referred to as being "on" another layer or substrate, it can be directly on the other layer or substrate or intervening layers may also be present. In contrast, when an element is referred to as being "directly on" another element, there are no intervening elements present. Moreover, each embodiment described and illustrated herein includes its complementary conductivity type embodiment as well.

The present invention relates to a method for fabricating a stacked capacitor having HSG silicons. More particularly, the present invention provides a reliable capacitor of increased capacitance. To this end, after formation of the HSG silicons, a protection layer composed of a nitride is formed thereon.

FIG. 1 schematically illustrates a cross-section of a stacked capacitor according to an embodiment of the present invention. The stacked capacitor is made of a cylindrical storage node 122 with HSG silicons 124 on interior thereof. A dielectric layer is also provided on the HSG silicons 124. This dielectric layer comprises a protection nitride layer 126, another nitride layer 132 and an oxide layer 134. A plate node 136 is provided on the dielectric layer, as illustrated by FIG. 1. Interior cylinder, the protection nitride layer 126 is formed on the HSG silicons. The dielectric layer on the exterior of the cylindrical storage node 122 is composed of the nitride layer 132 and the oxide layer 134. The bottom of the cylindrical storage node is electrically connected to an active region of the substrate 100 through a contact plug 112 formed in insulating layers 106 and 110.

The protection nitride layer 126 is formed to a thickness sufficient to protect HSG silicons during cleaning process, for example, at least 5 angstroms. Preferably, it is formed to a thickness of about 5 angstroms to 25 angstroms.

Figure 2A:
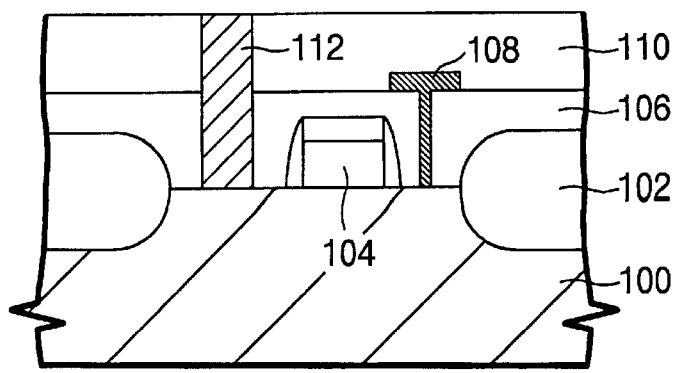
FIGS. 2A to 2H show schematically cross-sectional views of an integrated circuit substrate, at selected stages of a method for fabricating the stacked capacitor of FIG. 1.

Process steps for fabricating the stacked capacitor shown in FIG. 1 is described fully hereinafter with reference to FIGS. 2A to 2H. FIG. 2A illustrates a cross-sectional view of an integrated circuit substrate 100 having undergone certain process steps in accordance with the embodiment of the present invention. More specifically, there is provided the integrated circuit substrate 100. The substrate is a portion of a wafer on which a variety of semiconductor devices are formed. To define active region to which electrical connection is to be made, a device isolation layer 102 is formed in and on the substrate 100. The device isolation layer 102 surrounds the active region to electrically isolate each active region. The device isolation layer 102 may be formed by a local oxidation of silicon technique or a shallow trench isolation technique. Other suitable technique also may be used. Transistors are formed running the active region, for example, a transistor 104 is formed. Though a variety of transistors are formed simultaneously, only one transistor 104 is illustrated in the drawings for clarity. Likewise only on bit line and one capacitor is shown in the drawings.

The transistor is formed by conventional method well known in the art. Briefly explaining, first a gate oxide layer is formed. A gate electrode layer is deposited thereon. Preferably, the gate electrode layer is made of a multilayer structure of a polysilicon and a metal silicide such as tungsten silicide. A capping layer is then formed on the gate electrode layer. Through photolithographic process, selected portions of the deposited layers are etched to form gate electrode patterns. Through conventional impurity ions implantation, source/drain regions are formed laterally to the gate electrode patterns. Sidewall spacers are formed on lateral edges of the gate electrodes patterns to complete the transistor.

A first insulating layer 106 is deposited on the resulting structure conventionally. For example, the first insulating layer 106 may be an oxide layer of borophosphosilicate glass(BPSG) or tetraethylorthosilicate (TEOS). Next, a variety of bit line patterns are formed on the first insulating layer 106, for example, a bit line pattern 108 is formed. The bit line 108 is electrically connected to one side of the source/drain region. After the formation of the bit line pattern 108, a second insulating layer 110 is deposited on the first insulating layer 106 and on the bit line pattern 108. For example, the second insulating layer 110 is made of an oxide layer of TEOS or BPSG.

Selected portion of the oxide layers 110 and 106 is etched through conventional photo-etching process to form a contact hole therein, exposing the other side of the source/drain region. A conductive material is deposited on the second oxide layer 110 to fill the contact hole. Planarization process is carried out down to the second oxide layer 110 to form a contact plug 112 as shown in FIG. 2A. The conductive layer may be a doped polysilicon.

Alternatively, prior to the deposition of the conductive material, a sidewall spacer may be formed on sidewalls of the contact hole. Namely, after formation of the contact hole, a material layer such as nitride is deposited and then etched back to form the sidewall spacer.

Figure 2B:
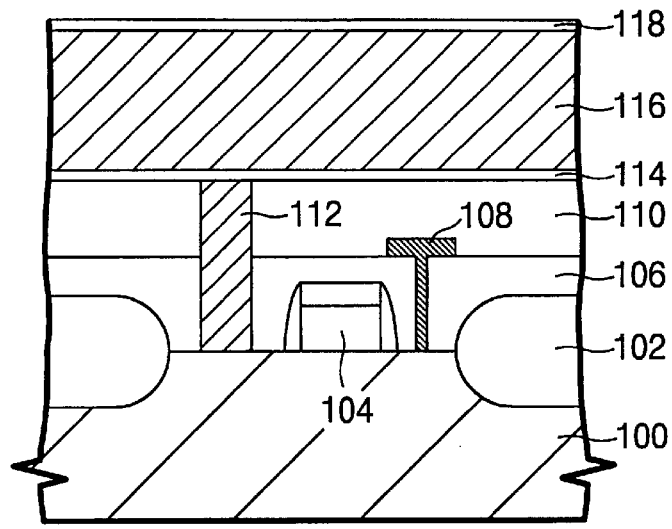

Next process sequences are the formation of the stacked capacitor. Referring now to FIG. 2B, an etching stopper nitride layer 114 that has an etching selectivity with respective to an oxide is deposited on the second oxide layer 110 and the contact plug 112. The etching stopper layer 114 is made of a first nitride by LPCVD(low pressure chemical vapor deposition) technique, having a thickness of about 300 angstroms. Next, a third insulating layer 116 is formed on the first nitride layer 114. The third insulating layer is made of an oxide layer using TEOS source and has a thickness at least over the desired heigh of the later-formed storage node. For example, the third insulating layer 116 is formed to a thickness of about 12,000 angstroms. In order to minimize the critical dimension(CD) variation, an anti-reflection coating layer 118 is formed on the third oxide layer 116, having a thickness of about 260 angstroms. The anti-reflection coating layer 118 comprises a silicon oxynitride layer.

Figure 2C:
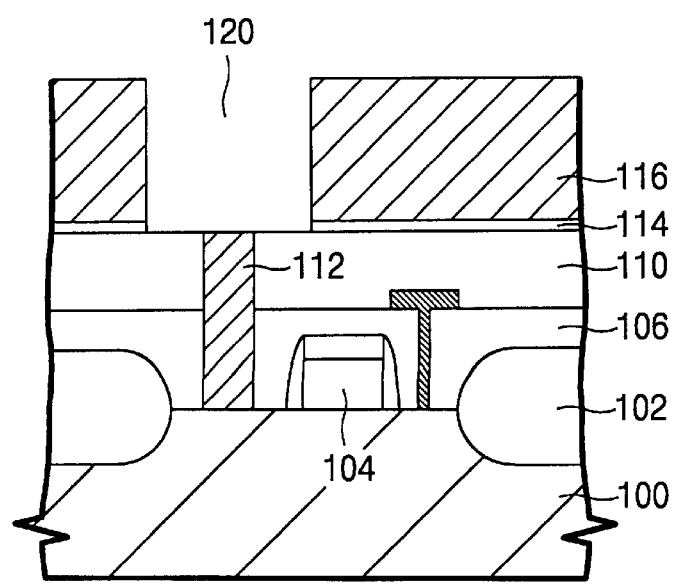

Next process sequence is the formation of a cylindrical opening 120 for a storage node in the third oxide layer 116 and the first nitride layer 114 which is schematically illustrated in FIG. 2C. More specifically, a photoresist layer(not shown) is spin coated on the anti-reflection coating layer and patterned into a predetermined configuration. Using the patterned photoresist layer, the anti-reflection coating layer 118 and the third oxide layer 116 are etched. After removing the patterned photoresist layer through conventional ashing and stripping process, the exposed first nitride layer 114 is then removed together with the anti-reflection coating layer 118 and thereby forming a cylindrical opening 120.

Figure 2D:
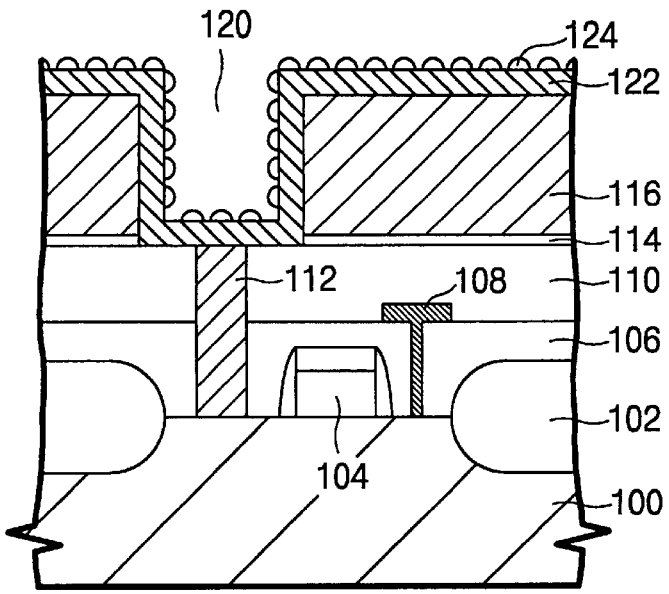

The formation of the storage node is next addressed with reference to FIGS. 2D–2G. As illustrated by FIG. 2D, as for a storage node is deposited in the opening 120 and on the third oxide layer 116. The first conductive layer 122 is formed to a thickness to ensure the formation of HSG silicons thereon, about 500 angstroms or more. In this embodiment, the first conductive layer 122 is formed to a thickness of about 500 angstroms to 600 angstroms. After that, HSG silicons 124 are formed on the first conductive layer in order to increase an available surface area.

Figure 2E:
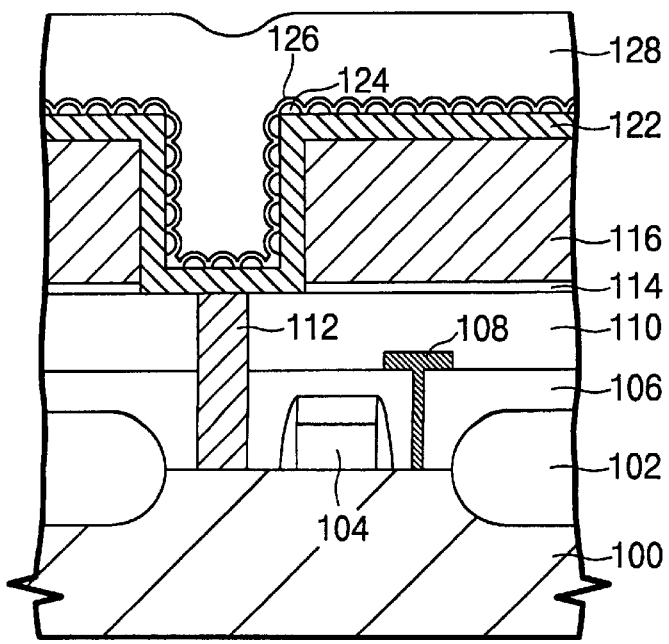

As illustrated by FIG. 2E, an HSG silicon protection layer 126 is then deposited in order to protect HSG silicons 124 during subsequent cleaning process. The HSG silicon protection layer 126 is made of a nitride that has a good etching selectivity with respect to subsequent planarization layer of an oxide. This protection nitride layer 126 is formed to a thickness at least 5 angstroms sufficient to serve as protection layer. In this embodiment, the nitride protection layer 126 is formed to a thickness in the range of about 5 angstroms to about 25 angstroms.

A planarization layer 128 composed of an oxide is deposited to completely fill the remainder of the opening. This planarization layer 128 serves to protect the contamination of the interior opening during subsequent planarization process. The planarization oxide layer 128 is made of undoped silicate glass(USG) oxide, having a thickness of about 3,000 angstroms.

Figure 2F:
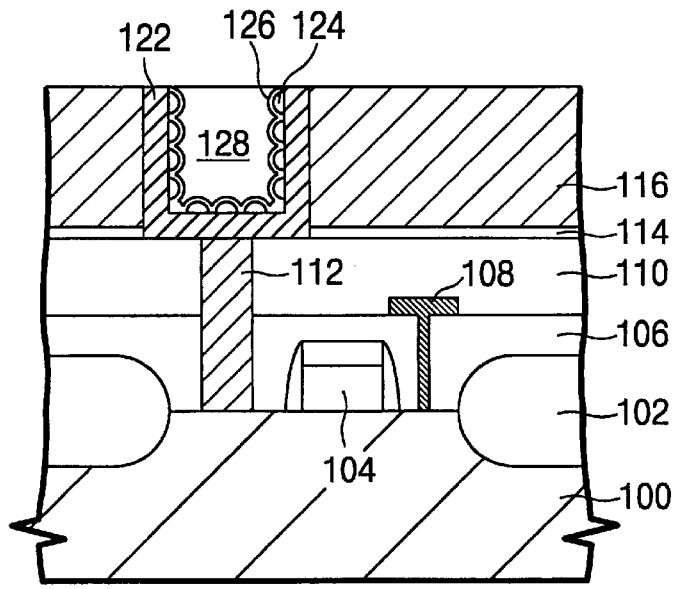

Planarization process is then performed down to the third oxide layer 116 as shown in FIG. 2F for separation of each storage node and thereby to form a storage node. During this planarization process, the planarization layer 128 serves to protect the contamination and defects of the interior storage node.

Figure 2G:
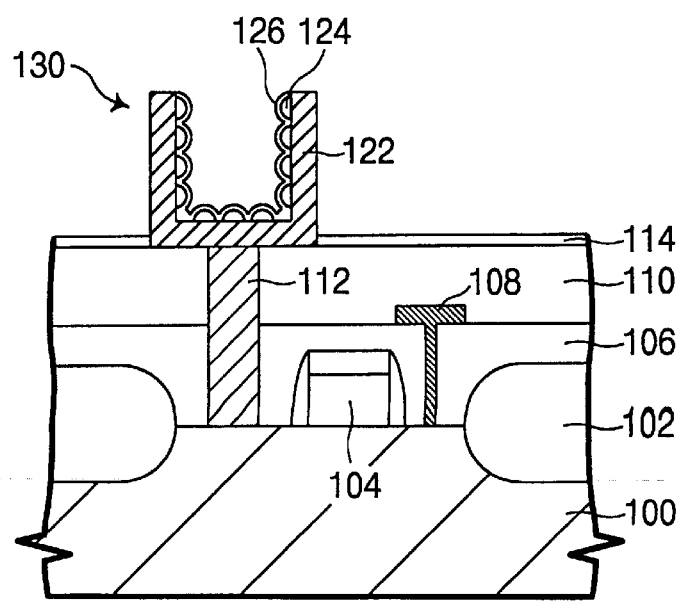

As illustrated by FIG. 2G, the remainder of the planarization layer 128 in the interior storage node is removed to complete the storage node. Optionally, the third oxide layer 116 outside the storage node may be further removed concurrently and resulting storage node 130 is illustrated in FIG. 2G. The removal of these layers is carried out by using wet chemical such as LAL 200 solution. Since the protection nitride layer 126 is resistant to the LAL solution, the underlying HSG silicons 124 can be protected.

Figure 2H:
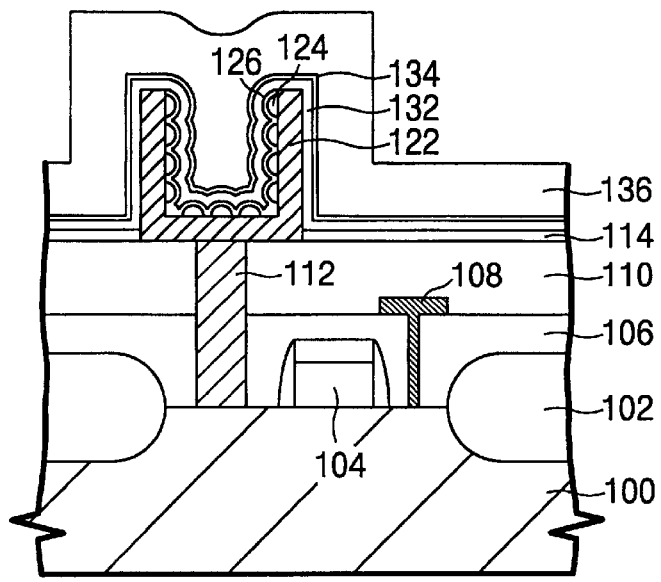

Referring now to FIG. 2H, a dielectric nitride layer 132 is formed on the storage node 130. The dielectric nitride layer 132 is formed to a thickness in the range of about 35 angstroms to about 70 angstroms. To complete the dielectric nitride layer, an oxidation process is carried out to form an oxide layer 134 on the dielectric nitride layer 132. The oxidation process may be any one of wet oxidation and dry oxidation. In this embodiment, wet oxidation is carried out in $H_2O$ ambient at a temperature of about 850° C. for about 30 minutes using $O_2$ and the resulting oxide layer 134 has a thickness in the range of about 13 angstroms to 20 angstroms.

Finally, a second conductive material 136 is deposited on the dielectric layer to complete a stacked capacitor. Subsequently, metal interconnection and passivation process are carried out, conventionally.

Figure 3:
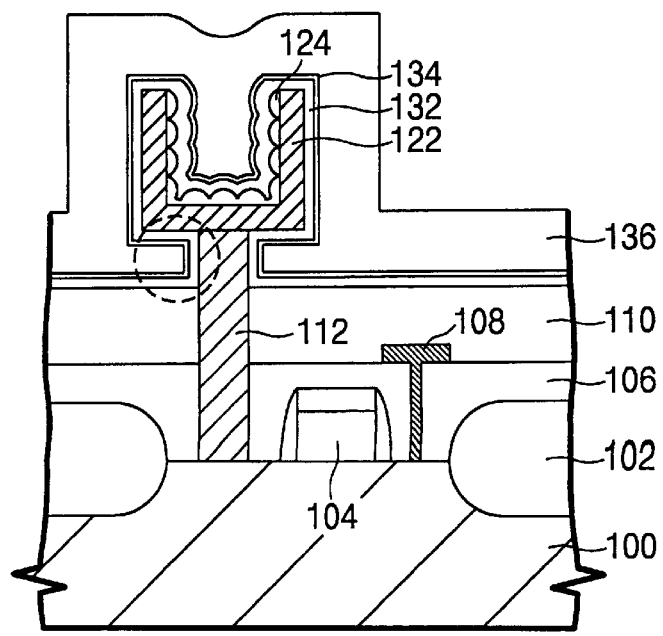
FIG. 3 shows schematically a cross-sectional view of a stacked capacitor having HSG silicons according to another embodiment of the present invention.

FIG. 3 schematically illustrates a stacked capacitor according to another embodiment of the present invention. Referring to FIG. 3, the stacked capacitor comprises a cylindrical storage node 122 with HSG silicons 124 interior thereof, a dielectric film and a plate node 136. The dielectric film is made of NO structure of a dielectric nitride 132 and a dielectric oxide layer 134. Undercut portions illustrated inside the circle are formed below the bottom edges of the storage node and thereby to further increase surface areas thereof. The bottom center of the storage node is electrically connected to a contact plug 112 that is buried in an insulating layers 106 and 110 to an active region of a semiconductor substrate 100.

Figure 4A:
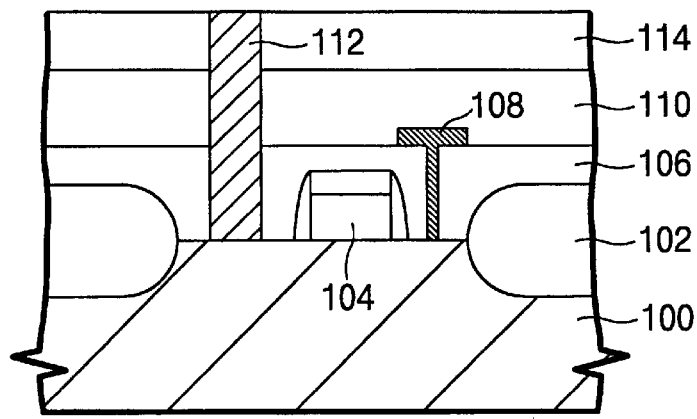
FIGS. 4A to 4I show schematically cross-sectional views of an integrated circuit substrate, at selected stages of a method for fabricating the stacked capacitor of FIG. 3.

Hereinafter, the method for fabricating the stacked capacitor shown in FIG. 3 will be described with reference to FIGS. 4A to 4I. In FIGS. 4A to 4I, same parts functioning as shown in FIGS. 2A to 2H are identified with same reference numbers. Referring now to FIG. 4A, a device isolation layer 102 is formed in and on a predetermined region of a semiconductor substrate 100 to define an active region. The active region is the region to which electrical connection is to be made. A transistor 104 is formed on the active region conventionally. The transistor 104 comprises a gate electrode with capping layer and sidewall spacer, and a pair of source/drain regions. As is well known in the art, a thin oxide layer is formed between the semiconductor substrate and the gate electrode for electrical separation.

A first insulating layer 106 preferably composed of an oxide is deposited on the transistor 104 and on the semiconductor substrate 100. A bit line pattern 108 is formed on the first oxide layer 106 to be electrically connected to one of the pair of the source/drain regions through selected portion of the first oxide layer 106. After that, a second insulating layer 110 composed of an oxide layer is then deposited on the first insulating layer 106. Then a first nitride layer 114 as for undercut formation is deposited on the second oxide layer 110. The first nitride layer 114 is formed by a well-known technique such as low pressure chemical vapor deposition(LPCVD) to a thickness in the range of about 300 angstroms to 2,000 angstroms. The next process sequence is the formation of a contact plug. Through conventional photo-etching process, selected portions of the deposited layers 114, 110 and 106 are etched to form a contact hole therein to the other of the source/drain regions. The contact hole is then filled with a conductive material and planarized to form a contact plug 112. The conductive material comprises a doped polysilicon, a metal, or the like.

Figure 4B:
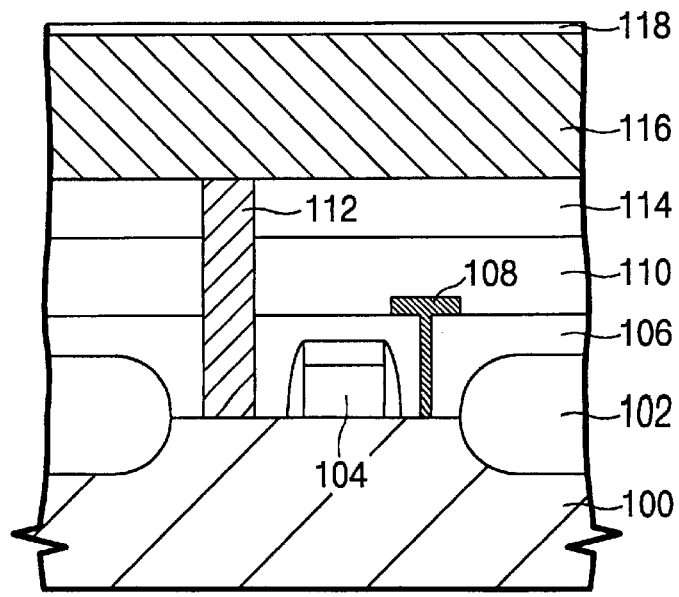
Figure 4C:
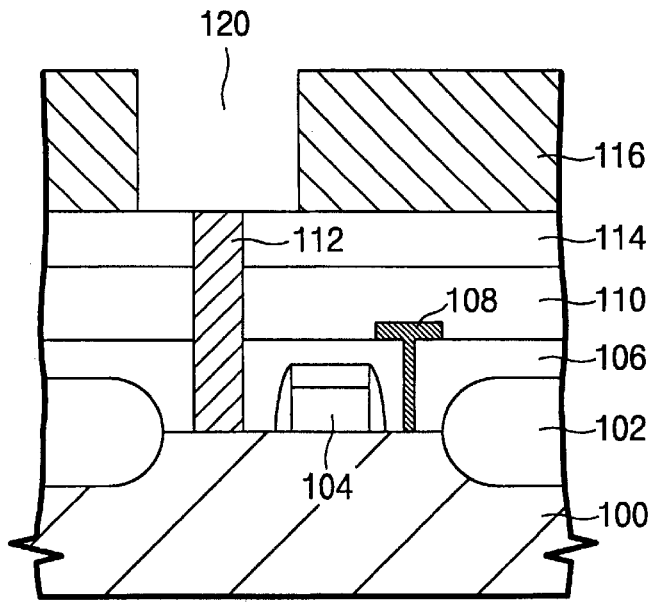

Referring now to FIG. 4B, a third insulating layer 116 composed of an oxide and an anti-reflection coating layer 118 are deposited on the first nitride layer 114 and on the contact plug 112. The third oxide layer 116 is formed to a thickness at least over desired height of the storage node, for example having a thickness of about 12,000 angstroms. The anti-reflection coating layer 118 is provided to minimize critical dimension(CD) variation of the photo process. The anti-reflection coating layer 118 is formed to a thickness of about 260 angstroms. A photoresist layer is then spin coated on entire surface of the substrate 100 and patterned into a predetermined configuration. Using this patterned photoresist layer, the anti-reflection coating layer 118 and the third oxide layer are anisotropically etched to form an opening 120 in which a conductive material is deposited for the formation of storage node, as shown in FIG. 4C. After that, the patterned photoresist layer and anti-reflection coating layer are removed.

Figure 4D:
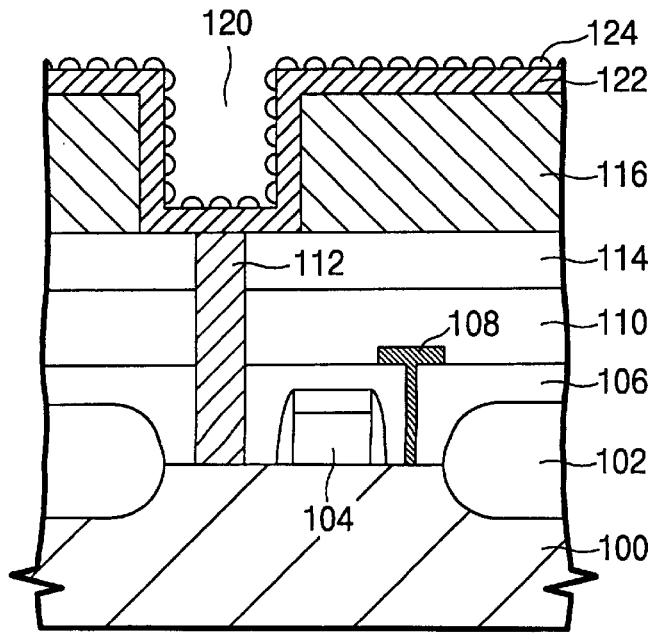

A first conductive layer 122 is deposited in the opening and on the third oxide layer 116 as shown in FIG. 4D. The first conductive layer is served as a frame for HSG silicons formation, having a thickness in the range of about 500 angstroms to about 600 angstroms. In order to increase surface areas, HSG silicons 124 are formed on the first conductive layer 122.

Figure 4E:
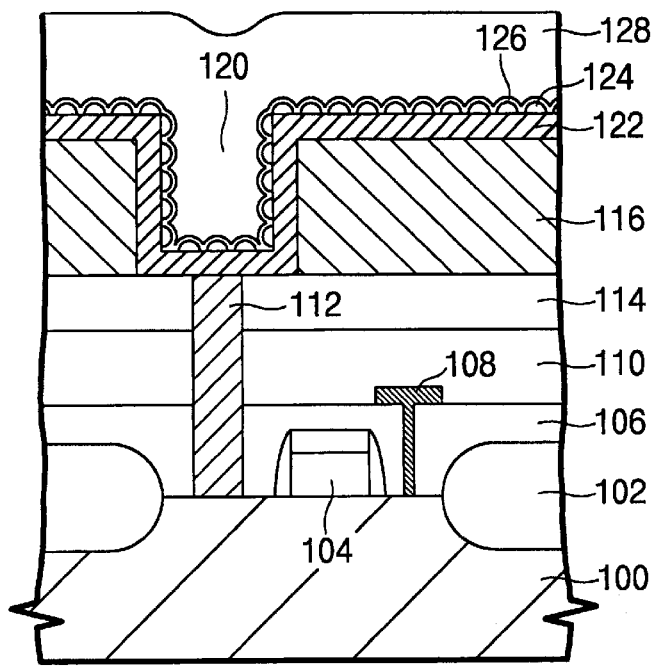

After the formation of HSG silicons 124, a second protection nitride layer 126 is deposited to protect HSG silicons during subsequent cleaning process. The second protection nitride layer 126 is formed by LPCVD technique to a thickness in the range of about 5 angstroms to 25 angstroms. This nitride layer can remain and be used a dielectric component. The remainder of the opening is completely filled with a planarization layer 128. The planarization layer is provided to protect the contamination and defects of the interior opening during planarization process as shown in FIG. 4E.

Figure 4F:
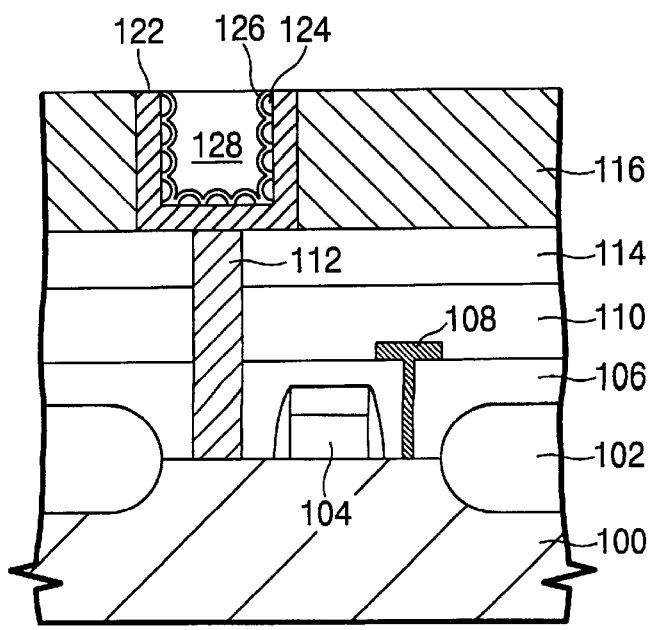
Figure 4G:
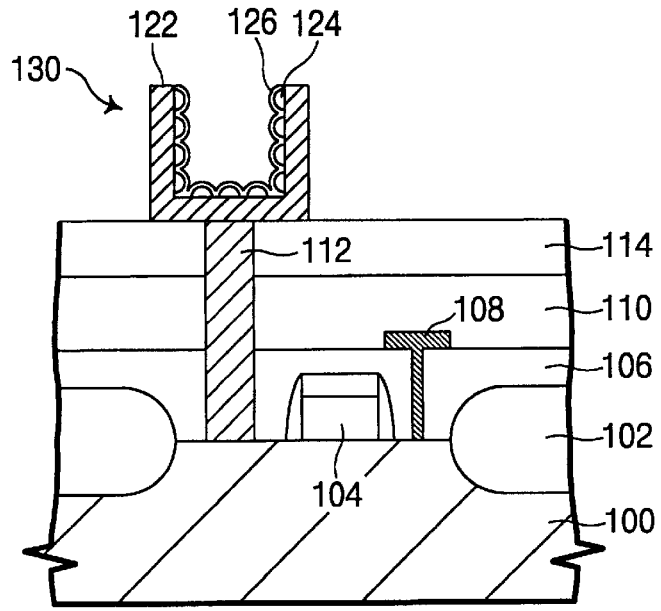
Figure 4H:
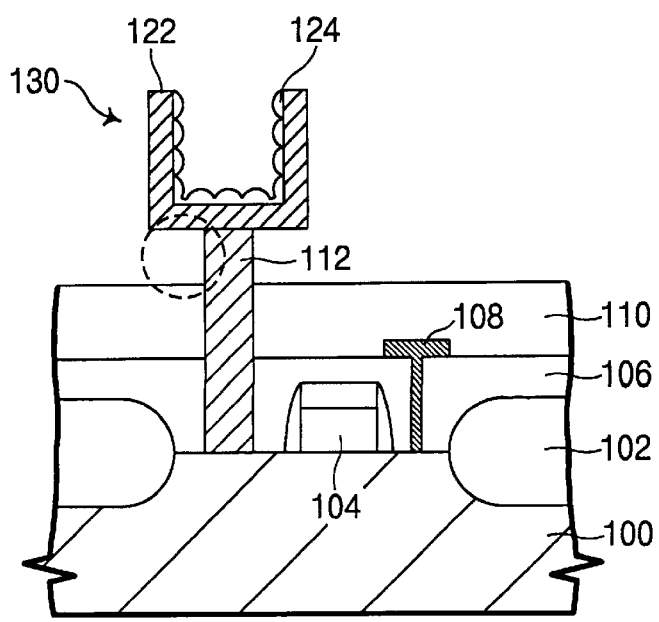

For electrical separation, planarization process such as CMP is carried out on the planarization layer 128 down to the third oxide layer 116 as shown in FIG. 4F. Next, cleaning process using wet chemical such as LAL solution is carried out to remove the planarization layer and third oxide layer to form the storage node 130 as shown in FIG. 4G. During this cleaning process, HSG silicons 124 can be protected due to the second protection nitride layer 126 that is resistant to LAL solution.

Next process sequence is the undercutting formation. The first nitride layer 114 is removed by using phosphoric acid to form undercutting portion as illustrated inside the circle of FIG. 4H. During this process, the second protection nitride layer is also currently removed. The undercutting portion can further increase surface areas.

Next process sequence is the formation of a dielectric layer. First, a third dielectric nitride layer 132 is deposited on the storage node. The third dielectric nitride layer 132 is formed to a thickness in the range of about 35 angstroms to about 70 angstroms. To complete dielectric of NO structure, oxidation process is carried out to form a dielectric oxide layer 134, having a thickness in the range of about 13 angstroms to about 20 angstroms. The oxidation process may be any of wet or dry oxidation. Wet oxidation can be carried out in $H_2O$ ambient at a temperature of about 850° C. for about 30 minutes using $O_2$. Alternatively, the dielectric oxide 134 can be formed by oxidizing the third dielectric nitride.

Figure 4I:
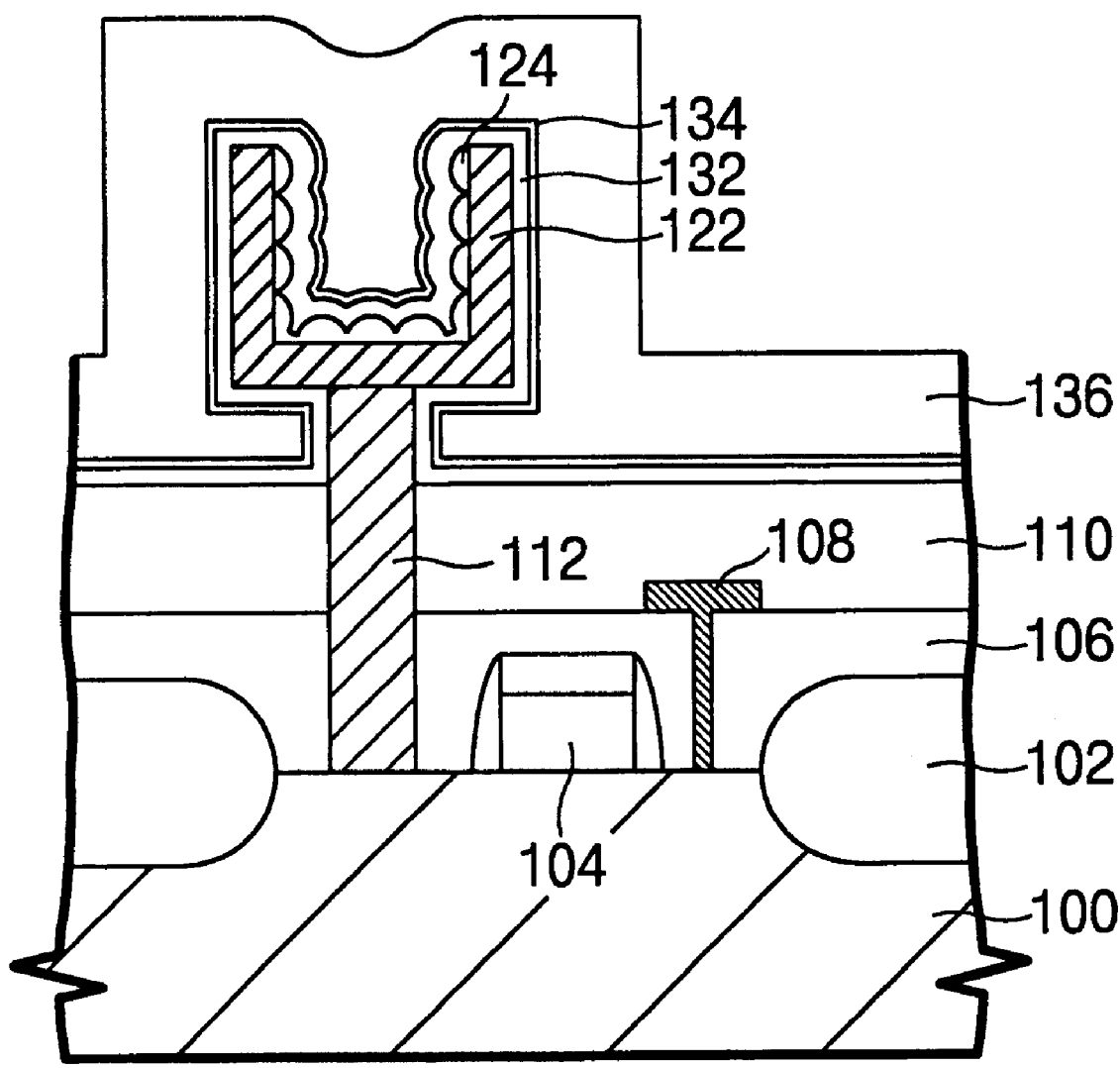

Subsequently, a second conductive layer 136 as for a plate node is deposited on the resulting structure to complete the stacked capacitor as shown in FIG. 4I. Conventional metal interconnection and passivation processes are carried out.

In above method, the second protection nitride layer 126 can be removed after removing the insulating layers 116 and 128.

The present invention provides a reliable capacitor having HSG silicons that can prevent separation of HSG silicon from storage node during various cleaning process of semiconductor manufacturing. The HSG silicon can be protected from cleaning etchant by forming a protection layer of silicon nitride thereon.

It will be recognized by those skilled in the art that the innovative concepts disclosed in the present application can be applied in a wide variety of contexts. Moreover, the preferred implementation can be modified in a tremendous variety of ways. Accordingly, it should be understood that the modification and variations suggested below and above are merely illustrative. These examples may help to show some of the scope of the inventive concepts, but these examples do not nearly exhaust the full scope of variation in the disclosed novel concepts. The present invention can be applied to all the methods for fabricating a capacitor having HSG silicons.

What is claimed is:

1. A method for fabricating a cylindrical capacitor having HSG silicon on inner surface of a storage node of the cylindrical capacitor, comprising:

forming a cylindrical storage node in a first insulating layer that is formed on an integrated circuit substrate;

forming HSG silicons on an inner surface of the storage node;

forming an HSG silicon protection layer;

forming a planarization layer on the first insulating layer to completely fill the interior cylinder;

planarization etching the planarization layer down to a top surface of the first insulating layer;

removing the remainder of the planarization layer from the interior cylinder;

forming a thin second insulating layer on the HSG silicon protection layer;

forming an oxide layer on the thin second insulating layer and completing a dielectric film of a nitride/oxide; and forming a plate node on the dielectric film to complete the capacitor.

2. The method according to claim 1, wherein the HSG silicon protection layer is made of a nitride layer.

3. The method according to claim 2, wherein the nitride layer is formed to a thickness in the range of about 5 angstroms to about 25 angstroms.

4. The method according to claim 1, wherein the thin second insulating layer is made of a nitride layer and has a thickness in the range of about 35 angstroms to about 70 angstroms.

5. The method according to claim 1, wherein the oxide layer is formed to a thickness in the range of about 13 angstroms to about 20 angstroms.

6. The method according to claim 1, wherein the step of forming a storage node comprises, etching the first insulating layer to form a cylindrical opening and depositing a conductive material as for a storage node in the cylindrical opening.

7. The method according to claim 1, further comprising cleaning the HSG silicon protection layer prior to the formation of the thin second insulating layer.

8. The method according to claim 1, further comprising a third insulating layer between the substrate and the first insulating layer, wherein a contact plug is buried in the third insulating layer and electrically connects a bottom of the storage node to an active region of the substrate.

9. The method according to claim 8, further comprising a stopper silicon nitride layer on a top surface of the third insulating layer.

10. The method according to claim 9, further comprising removing the first insulating layer outside of the storage node prior to the formation of the thin second insulating layer and removing the stopper silicon nitride layer to form an undercutting portion below the storage node to increase a surface area.

11. A method for fabricating a cylindrical capacitor having HSG silicons on an interior of a cylindrical storage node, the method comprising:
    forming a first oxide layer on an integrated circuit substrate having an active region;
    forming a first nitride layer on the first oxide layer;
    forming a contact plug in the first nitride layer and oxide layer to be electrically connected to the active region of the substrate;
    forming a second oxide layer on the first nitride layer and on the contact plug;
    etching the second oxide layer to form a cylindrical opening to at least the contact plug;
    forming a first conductive layer in the opening and on the second oxide layer;
    forming HSG silicons on the first conductive layer;
    forming a second nitride layer on the HSG silicons to protect thereof;
    forming a third oxide layer on the second oxide layer to completely fill the cylindrical opening;
    planarizing the third oxide layer down to a top surface of the second oxide layer;
    using the second nitride layer as a stopper and removing second and remainder of the third oxide layer to form a storage node;
    removing the second nitride layer and forming an undercutting portion below the storage node;
    forming a third nitride layer on a surface of the storage node;
    forming a fourth oxide layer on the third nitride layer and completing a dielectric layer of a nitride/oxide; and
    forming a second conductive layer as for a plate node to form a capacitor.

12. The method according to claim 11, wherein the first nitride layer is formed to a thickness in the range of about 300 angstroms to about 2,000 angstroms.

13. The method according to claim 11, wherein the second nitride layer is formed to a thickness in the range of about 5 angstroms to 25 angstroms.

14. The method according to claim 11, wherein the third nitride layer is formed to a thickness in the range of about 35 angstroms to about 70 angstroms.

15. The method according to claim 11, wherein the fourth oxide layer is formed to a thickness in the range of about 13 angstroms to about 20 angstroms.

16. A method of forming an integrated circuit capacitor, comprising the steps of:
    forming a first capacitor electrode comprising silicon on a substrate;
    forming an HSG silicon layer on the first capacitor electrode;
    forming an electrically insulating HSG protection layer comprising a first material on the HSG silicon layer;
    forming an electrically insulating layer comprising a second material on the HSG protection layer;
    etching back the electrically insulating layer to expose the HSG protection layer, using a wet etchant that selectively etches the second material at a faster rate than the first material;
    forming a capacitor dielectric layer on the HSG silicon layer; and
    forming a second capacitor electrode on the capacitor dielectric layer, opposite the first capacitor electrode.

17. The method of claim 16, wherein said step of forming an HSG silicon layer comprises selectively forming an HSG silicon layer on a first portion of the first capacitor electrode but not on a second portion of the first capacitor electrode; and wherein said step of forming a capacitor dielectric layer is preceded by the step of forming a nitride protection layer on the HSG protection layer and on the second portion of the first capacitor electrode.

18. The method of claim 17, wherein the HSG protection layer comprises silicon nitride.

19. The method of claim 17, wherein the HSG protection layer comprises a silicon nitride layer having a thickness in a range between about 5 Å and 25 Å; and wherein the nitride protection layer has a thickness in a range between about 35 Å and 70 Å.

20. A method of forming an integrated circuit capacitor, comprising the steps of:
    forming a first electrically insulating layer having a conductive plug therein, on a semiconductor substrate;
    forming a second electrically insulating layer on the first electrically insulating layer;
    selectively etching the second electrically insulating layer to define an opening therein that exposes the conductive plug;
    conformally depositing a silicon conductive layer that extends into the opening and contacts the conductive plug, on the second electrically insulating layer;
    forming an HSG silicon layer on an upper surface of the silicon conductive layer;
    forming an electrically insulating HSG protection layer comprising silicon nitride on the HSG silicon layer;
    forming a third electrically insulating layer on the HSG protection layer;
    planarizing the third electrically insulating layer, the HSG protection layer, the HSG silicon layer and the silicon conductive layer in sequence to expose the second electrically insulating layer and define a first U-shaped capacitor electrode;
    selectively etching a portion of the third electrically insulating layer extending into the contact hole, using the HSG protection layer as an etch stop layer;
    forming a capacitor dielectric layer on the HSG protection layer; and
    forming a second capacitor electrode on the capacitor dielectric layer, opposite the first U-shaped capacitor electrode.

\* \* \* \* \*